US009347696B2

(12) United States Patent
Carlson et al.

(10) Patent No.: US 9,347,696 B2
(45) Date of Patent: *May 24, 2016

(54) COMPACT AMPOULE THERMAL MANAGEMENT SYSTEM

(71) Applicant: APPLIED MATERIALS, INC., Santa Clara, CA (US)

(72) Inventors: David K. Carlson, San Jose, CA (US); Errol Antonio C. Sanchez, Tracy, CA (US); Kenric Choi, San Jose, CA (US); Marcel E. Josephson, San Jose, CA (US); Dennis Demars, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 278 days.

This patent is subject to a terminal disclaimer.

(21) Appl. No.: 13/902,304

(22) Filed: May 24, 2013

(65) Prior Publication Data

US 2013/0319013 A1 Dec. 5, 2013

Related U.S. Application Data

(60) Provisional application No. 61/655,767, filed on Jun. 5, 2012.

(51) Int. Cl.
*F25B 21/02* (2006.01)
*C23C 16/448* (2006.01)

(52) U.S. Cl.
CPC ............... *F25B 21/02* (2013.01); *C23C 16/448* (2013.01); *C23C 16/4482* (2013.01)

(58) Field of Classification Search
CPC .......... F25B 21/02; H01L 35/30; F25D 11/00
USPC ..................... 62/3.2, 3.6, 3.7, 259.2
See application file for complete search history.

(56) References Cited

U.S. PATENT DOCUMENTS

| 7,261,118 | B2 | 8/2007 | Birtcher et al. | |
|---|---|---|---|---|
| 7,413,774 | B2 | 8/2008 | Kobrin et al. | |
| 2008/0168795 | A1* | 7/2008 | Alfille | 62/457.9 |
| 2009/0084112 | A1* | 4/2009 | Ham | 62/3.2 |
| 2010/0065972 | A1 | 3/2010 | Liu | |
| 2010/0186423 | A1* | 7/2010 | Veltrop et al. | 62/3.6 |

FOREIGN PATENT DOCUMENTS

KR 10-2010-0124383 A 11/2010

OTHER PUBLICATIONS

International Search Report and Written Opinion mailed Oct. 22, 2013 for PCT Application No. PCT/US2013/044256.

* cited by examiner

*Primary Examiner* — Melvin Jones
(74) *Attorney, Agent, or Firm* — Moser Taboada; Alan Taboada

(57) ABSTRACT

Apparatus for thermal management of a precursor for use in substrate processing are provided herein. In some embodiments, an apparatus for thermal management of a precursor for use in substrate processing may include a body having an opening sized to receive a storage container having a liquid or solid precursor disposed therein, the body fabricated from thermally conductive material; one or more thermoelectric devices coupled to the body proximate the opening; and a heat sink coupled to the one or more thermoelectric devices.

19 Claims, 3 Drawing Sheets

COMPACT AMPOULE THERMAL MANAGEMENT SYSTEM

CROSS-REFERENCE TO RELATED APPLICATIONS

This application claims benefit of U.S. provisional patent application Ser. No. 61/655,767, filed Jun. 5, 2013, which is herein incorporated by reference.

FIELD

Embodiments of the present invention generally relate to semiconductor substrate processing.

BACKGROUND

Solid and liquid precursors are being used to provide gases in many semiconductor fabrication processes, for example, such as deposition of materials on a substrate. However, the inventors have observed numerous issues with conventional methods typically utilized to control a temperature of the solid or liquid precursor (e.g., a water bath, water jacket, heater jacket, or fire rods). For example, the conventional methods require significant space and support equipment to be implemented. In addition, some precursors are very unstable or water reactive, raising safety concerns regarding the conventionally utilized equipment.

Thus, the inventors have provided improved thermal management systems for processing solid or liquid precursors.

SUMMARY

Methods and apparatus for thermal management of a precursor for use in substrate processing are provided herein. In some embodiments, an apparatus for thermal management of a precursor for use in substrate processing may include a body having an opening sized to receive a storage container having a liquid or solid precursor disposed therein, the body fabricated from thermally conductive material; one or more thermoelectric devices coupled to the body proximate the opening; and a heat sink coupled to the one or more thermoelectric devices.

In some embodiments, an apparatus for thermal management of a precursor for use in substrate processing may include a body fabricated from a thermally conductive material, the body comprising two separable parts and an opening sized to receive a storage container at least partially formed in each of the two separable parts, wherein the storage container is configured to contain a liquid or solid precursor; one or more thermoelectric devices coupled to the body proximate the opening; a heat sink coupled to the one or more thermoelectric devices; and a thermally conductive plate coupled to each of the two separable parts of the body on a first side of the body and a second side of the body, opposite the first side.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
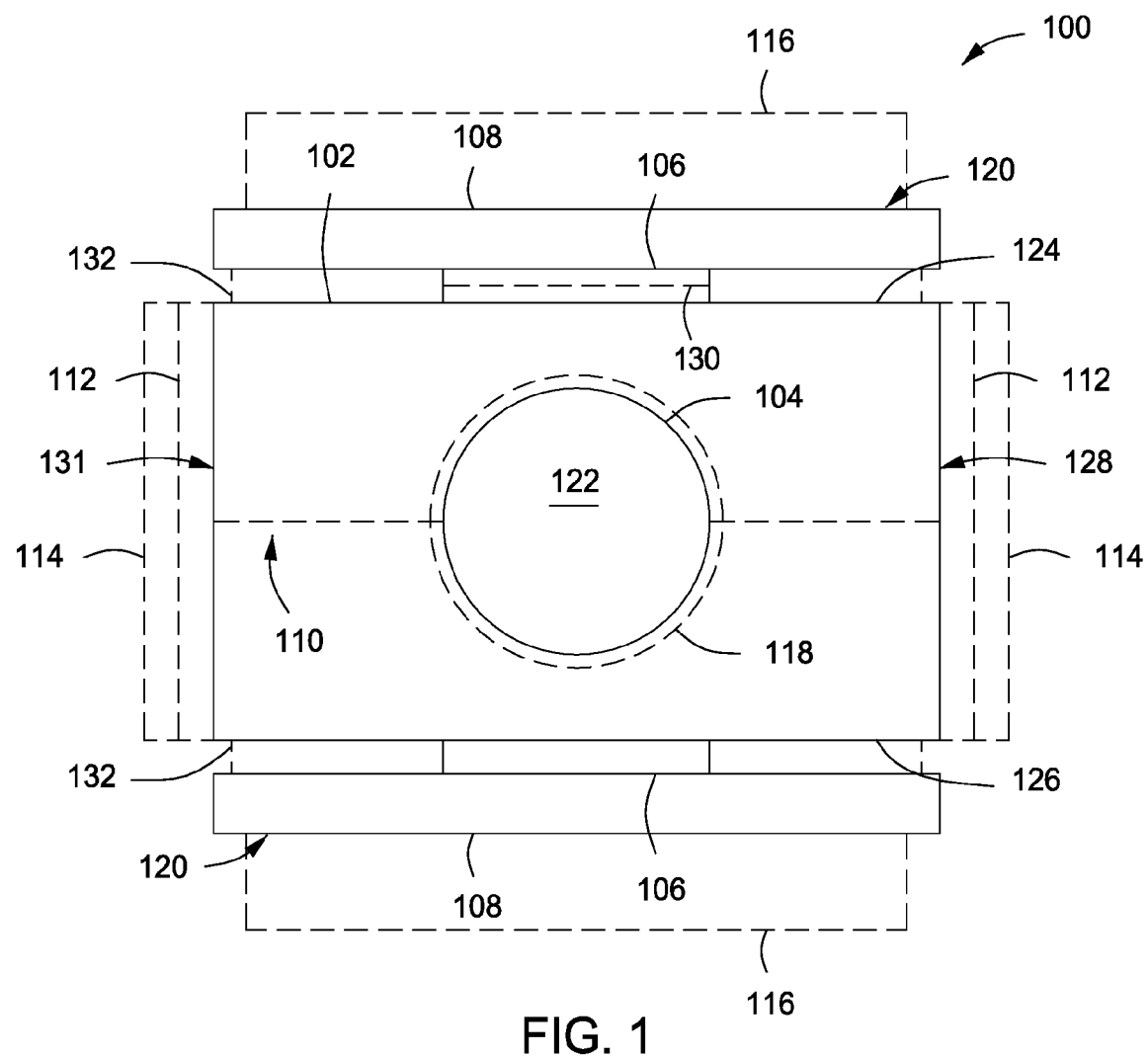
FIG. 1 is a schematic top view of an apparatus for thermal management of substrate processing precursors in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of an apparatus for thermal management of substrate processing precursors are provided herein. In at least some embodiments, the inventive apparatus advantageously facilitates controlling a temperature (e.g., heating and/or cooling) of individual ampoules for storing solid or liquid precursors. In addition, in at least some embodiments, the inventive apparatus facilitates controlling the temperature of the ampoules without the use of fluids, thereby reducing concerns (e.g., contamination or instability) regarding water exposure to certain precursors. Moreover, in at least some embodiments, the inventive apparatus advantageously limits a total power available for heating the precursors to reduce or prevent the possibility of overheating the precursor material. In addition, in at least some embodiments, the inventive apparatus further advantageously uses less space as compared to conventionally utilized equipment.

FIG. 1 is a schematic top view of an apparatus 100 for thermal management of substrate processing precursors in accordance with some embodiments of the present invention. In some embodiments, the apparatus 100 may generally include a body 102 having an opening 104 sized to receive a storage container 122 for holding and dispensing a precursor in liquid or solid form, for example, such as an ampoule. The inventive apparatus is not limited by the nature of the precursors being used in connection with the apparatus. For example, some applications may use water, some Group III/V material applications may use trimethyl gallium (TMGa), trimethyl indium (TMIn), trimethyl aluminum (TMAl), tertiary butyl arsine (TBAs), tertiary butyl phosphine (TBP), etc. Other chemicals can be used for Group IV materials and atomic layer deposition (ALD) applications.

The body 102 may be fabricated from any material suitable to and facilitate control over a temperature of the precursor. In some embodiments, the body 102 may be fabricated, at least in part, from a material with a high thermal conductivity. For example, in some embodiments, the body 102 may be fabricated from a metal, such as aluminum, copper, brass, or the like.

The opening 104 may have any dimensions suitable to allow the opening to receive and/or provide access to the storage container 122 (e.g., the ampoule). For example, in some embodiments, the opening 104 may be sized such that the storage container 122 fits snugly within the opening 104. Alternatively, in some embodiments, the opening 104 may be sized such that the storage container 122 fits loosely within the opening 104, with an air gap between the storage container 122 and a surface of the body 102 within the opening 104. In such embodiments, a seal 118 may be provided proximate the top of the body 102 between the storage container 122 and the body 102 to seal the volume within the opening 104. Alternatively, or in combination, in some embodiments, the opening 104 may be filled with a thermal compound, such as a thermal grease, to maintain robust thermal contact between the storage container 122 and the body.

In some embodiments, the body 102 may be configured to clamp the storage container 122 within the opening 104 to provide robust thermal contact with the storage container 122. By providing a robust thermal contact, the temperature of the storage container 122 may be controlled via a heat transfer between the storage container 122 and the body, thereby allowing for control of the temperature without the use of fluids (e.g., heat control fluids). Controlling the temperature of the storage container 122 without fluids eliminates potential concerns (e.g., contamination or instability of the precursor) that could otherwise result from incidental contact between a fluid and the precursor. In addition, control of the temperature without the use of fluids eliminates the need for space or conduits between the body 102 and the storage container 122, thereby using less overall space as compared to conventionally utilized equipment.

For example, as depicted by dashed lines 110, in some embodiments, the body 102 may be divided into two separable parts (first part 124 and second part 126 shown) having the opening 104 at least partially formed in each part 124, 126 such that the two parts of the body 102 may be bolted or otherwise secured together to clamp the storage container 122 within the opening 104. In such embodiments, a gap may exist between the two parts 124, 126 of the body 102, which may hinder thermal transfer between the storage container 122 and the body 102 in the regions proximate the gap. As such, in some embodiments, a thermally conductive plate 112 may be provided to facilitate thermal transfer between the two parts of the body 102. In such embodiments, a thermally conductive plate 112 may be coupled to each part 124, 126 of the body 102 on at least one of a first side 128 or a second side 131 of the body 102, opposite the first side 128.

In some embodiments, a thermally insulative material 114, such as a silicone foam or Teflon® (e.g., polytetrafluoroethylene, or PTFE), may be disposed on an outer surface of the thermally conductive plate 112, and optionally over one or more outer surfaces of the body 102. The thermally insulative material 114 may add an additional level of control over the path of thermal conduction to and from the body 102 (and ultimately to the storage container 122 when disposed in the opening 104). In addition, the thermally insulative material 114 may facilitate providing a cooler surface for handling the apparatus 100 when the heat sink 108 is at elevated temperatures.

One or more thermoelectric devices 106, such as a Peltier device, may be coupled to the body 102 proximate the opening 104. The one or more thermoelectric devices 106 operate to provide heat to, or remove heat from, the storage container 122 via the body 102. The one or more thermoelectric devices 106 may be disposed proximate the opening 104 in any configuration suitable to facilitate providing a desired amount of heat to or from the storage container 122 via the body 102. For example, in some embodiments, at least one thermoelectric device 106 is disposed on opposing sides of the body 102 proximate the opening 104. In some embodiments, a total power provided to the one or more thermoelectric devices 106 may be controlled via, for example, a controller, software, mechanical switch, or the like. By controlling the total power, a total power available for heating the precursors may be limited, thereby reducing or preventing the possibility of overheating the precursor material. In some embodiments, the one or more thermoelectric devices 106 comprise at least two thermoelectric devices 106.

In some embodiments, the one or more thermoelectric devices 106 may provide a thermal gradient across the body 102 during operation, thereby transferring heat from a cooler side of the body 102 to a hotter side of the body 102. In such embodiments, the thermal gradient may be controlled by varying a configuration of the one or more thermoelectric devices 106. For example, in some embodiments, the thermal gradient may be increased by stacking at least two thermoelectric devices 106 together (shown in phantom at 130) such that their respective thermal gradients are additive. For example, in some embodiments, a thermoelectric device 106 may have a gradient of about 50 to about 60 degrees Celsius. In some embodiments the one or more thermoelectric devices 106 may have an operational range of from about −10 degrees Celsius on the cool side to about 50 degrees Celsius on the hot side.

In some embodiments, a heat sink 108 is coupled to each thermoelectric device 106 to further facilitate removal of heat from the body 102 when the one or more thermoelectric devices 106 are operating in a cooling mode (i.e., cooling the storage container 122). In some embodiments, the heat sink 108 may span the entire width of the body 102. In some embodiments a thermally insulative material 132 (e.g., silicone foam, Teflon® (e.g., polytetrafluoroethylene, or PTFE), or the like), may be provided between the heat sink 108 and the body 102 in portions surrounding the one or more thermoelectric devices 106 such that only the one or more thermoelectric devices 106 are in robust thermal contact with the heat sinks 108. Such a configuration advantageously facilitates thermal transfer from the body 102 predominantly only through the one or more thermoelectric devices 106 and substantially prevents thermal transfer from the heat sink 108 back into the body 102.

In some embodiments one or more optional fans (two fans 116 shown) may be disposed proximate the heat sinks 108. When present, the optional fans may increase air flow to the heat sinks 108, thereby facilitating removal of heat from the body. In some embodiments, the fans 116 may be coupled to a back side 120 of each of the heat sinks 108, such as shown in FIG. 1.

Figure 2:
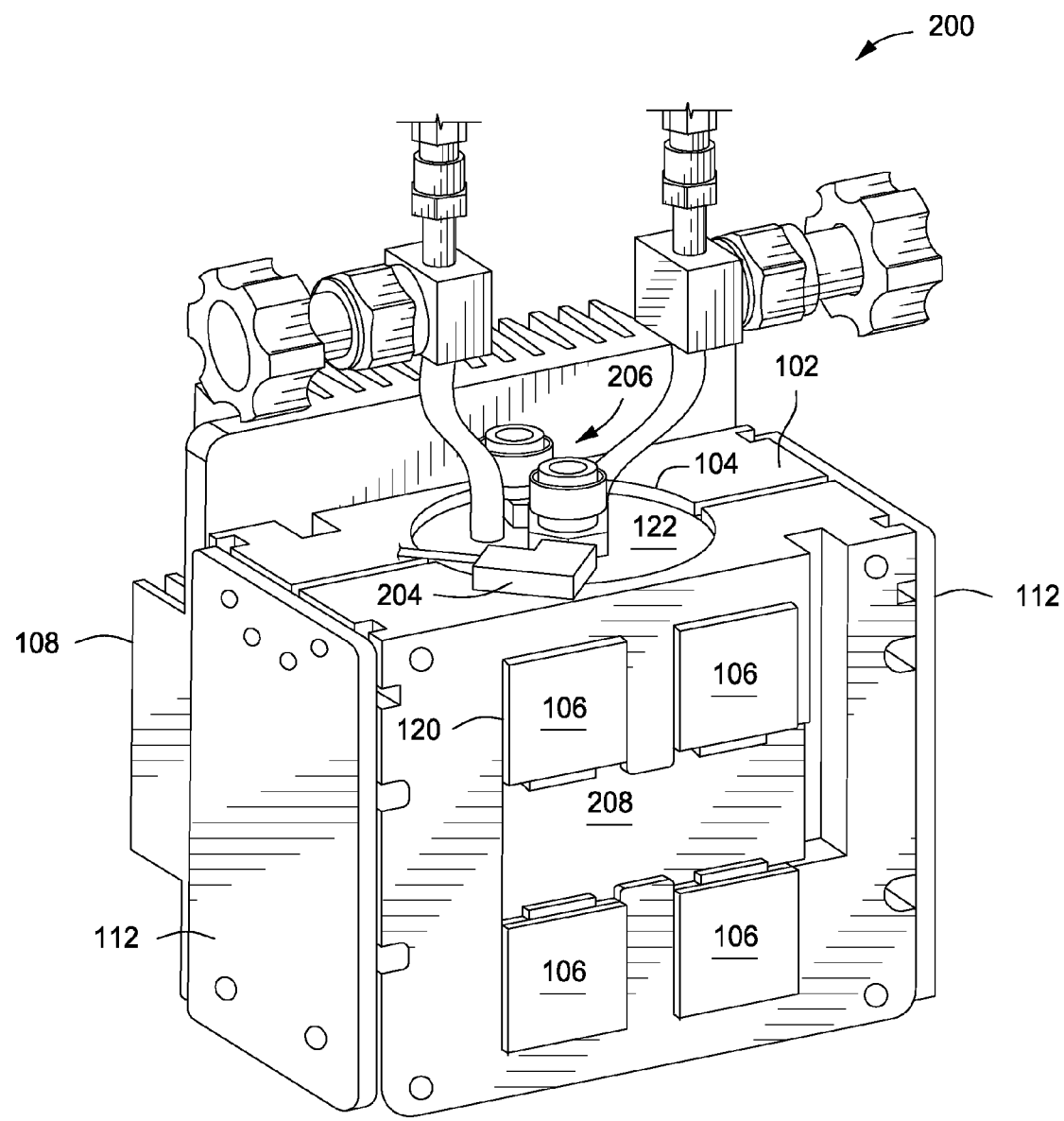
FIG. 2 is a perspective view of an apparatus for thermal management of substrate processing precursors in accordance with some embodiments of the present invention.

FIG. 2 is a perspective view of an exemplary apparatus 200 for thermal management of substrate processing precursors in accordance with some embodiments of the present invention. For clarity of explanation, one heat sink 108 has been removed from the front surface to enable a view of other components of the apparatus 200.

As shown in FIG. 2, the apparatus 200 includes a body 102 split into two halves surrounding the opening 104. The opening 104 retains a cylindrical storage container 122 (e.g., an ampoule) to hold and dispense a liquid or solid precursor. The two halves of the body 102 may be fastened together in any suitable manner, such as by clamping, bolting, or the like. For example, as depicted in FIG. 2, the two halves of the body 102 are bolted together. A thermally conductive plate 102 is fastened, for example by bolting, to each half of the body 102, on opposing sides of the body 102.

In some embodiments, four thermoelectric devices 106 are disposed on each side of the body 102. In such embodiments, the thermoelectric devices 106 may be partially set into the body 102 via cut-outs 210. Partially setting the thermoelectric devices 106 into the body may facilitate retaining the thermoelectric devices 106 and position the thermoelectric devices 106 closer to the opening 104, and, thus, the storage container 122 retained therein. In some embodiments, a recess 208 may be formed into the body and configured to route the electrical cables for operation of the thermoelectric devices 106.

In some embodiments, one or more thermocouples (one thermocouple 204 shown) may be provided to measure the temperature of the storage container 122 or the temperature of the contents of the storage container 122 (e.g., the solid or liquid precursor contained therein). For example, as shown in FIG. 2, a thermocouple 204 may coupled to the body 102 to measure the temperature of the storage container 122. Other thermocouples may be provided, for example through an opening in the container 122 (generally referred to as plumbing 206, discussed below) to facilitate measuring the temperature of the storage container 122 or the temperature of the contents of the storage container 122.

In some embodiments, the storage container 122 may be securely retained in the opening 104, for example by the bolting together of the halves of the body 104 to facilitate robust thermal contact between substantially the entire side perimeter of the storage container 122 and the body 102, for example, such as described above.

In some embodiments, the storage container 122 includes plumbing 206 for example, for the introduction of a carrier gas and the exit of a carrier gas/precursor mixture to and from the storage container 122 (for example, the conduits shown with valves attached). The plumbing 206 may accordingly be coupled to a gas source and one or more gas delivery zones, such as one or more zones of a process chamber for processing a substrate and a chamber foreline for diverting the carrier gas/precursor mixture to an exhaust system. Other plumbing may include conduits and/or ports for refilling the storage container 122 in place, without the need to remove or replace the storage container 122 from the apparatus 200; ports for providing access to the interior of the storage container, such as to provide access for a thermocouple to measure the temperature of the contents of the ampoule as discussed above, a liquid level sensor, or the like.

Figure 3:
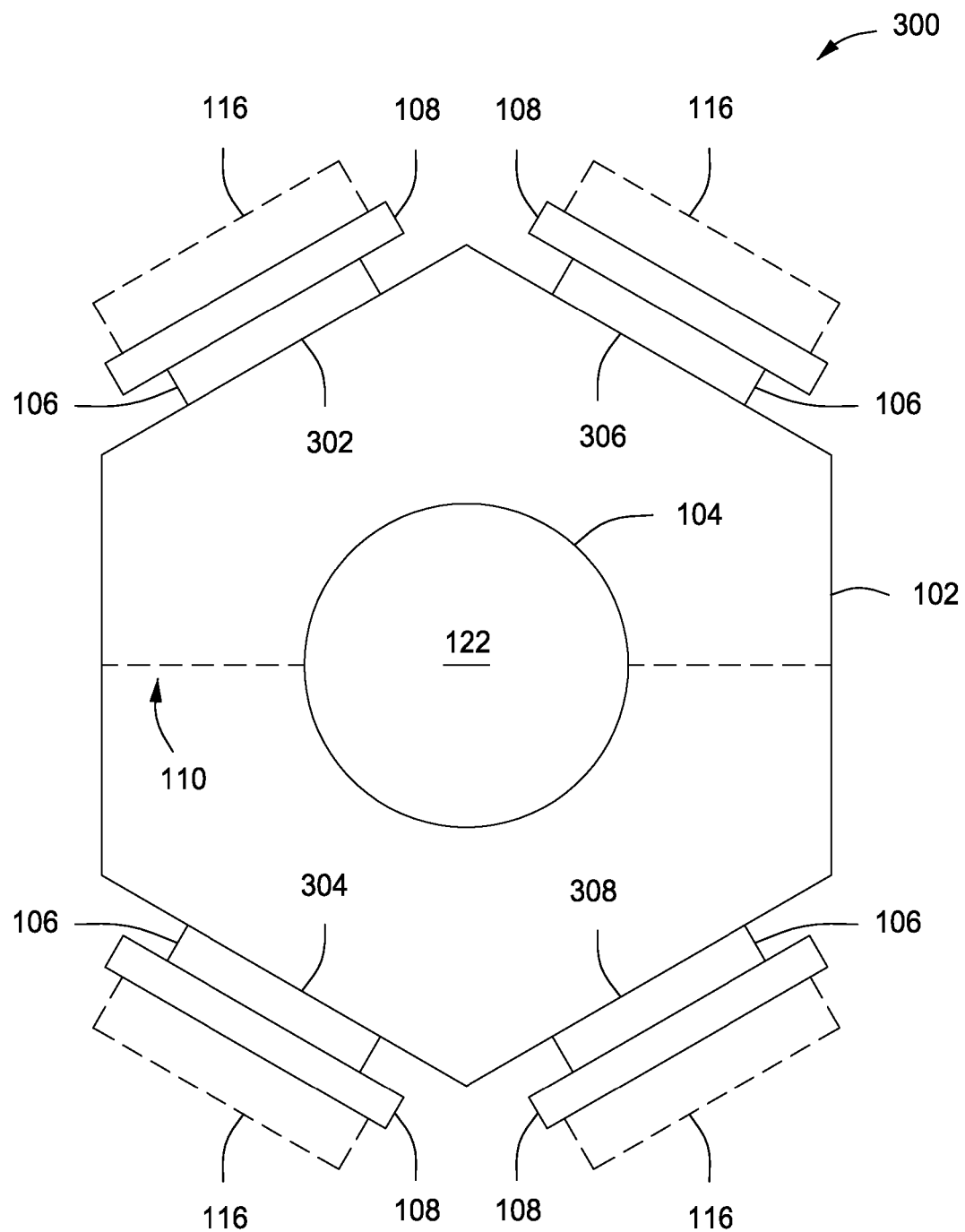
FIG. 3 is a schematic top view of an apparatus for thermal management of substrate processing precursors in accordance with some embodiments of the present invention.

Although the above embodiments are described in certain configurations, other variations are contemplated within the scope of the invention. For example, in some embodiments, a plurality of storage containers may be provided in a plurality of openings of the body. In addition, the opening may be shaped to correspond to the shape of the storage container, which does not necessarily need to be cylindrical. In addition, although shown as a box-like structure, the body 102 may have any shape suitable to facilitate controlling the temperature of the ampoules as described above. For example, referring to FIG. 3, in some embodiments, the body 102 may have a substantially hexagonal shape. In such embodiments, a thermoelectric device 106, heat sink 108 and optional fan 116 may be disposed on opposing sides 302, 306, 304, 308 of each half of the body 102.

Thus, embodiments of an apparatus for thermal management of substrate processing precursors have been provided herein. In at least some embodiments, the inventive apparatus advantageously facilitates controlling a temperature (e.g., heating and/or cooling) of individual ampoules for storing solid or liquid precursors without the use of fluids, thereby reducing concerns (e.g., contamination or instability) regarding water exposure to certain precursors.

While the foregoing is directed to embodiments of the present invention, other and further embodiments of the invention may be devised without departing from the basic scope thereof.

The invention claimed is:

1. An apparatus for thermal management of a precursor for use in substrate processing, comprising:
   a body having an opening sized to receive a storage container having a liquid or solid precursor disposed therein, the body fabricated from thermally conductive material, wherein the body comprises two separable parts, and wherein the opening is at least partially formed in each of the two separable parts;
   one or more thermoelectric devices coupled to the body proximate the opening; and
   a heat sink coupled to the one or more thermoelectric devices.

2. The apparatus of claim 1, wherein the body is made of aluminum, copper or brass.

3. The apparatus of claim 1, further comprising:
   a thermally insulative material disposed on one or more outer surfaces of the body.

4. The apparatus of claim 1, further comprising:
   a thermally conductive plate coupled to each part of the body on at least one of a first side of the body or a second side of the body, opposite the first side.

5. The apparatus of claim 4, further comprising:
   a thermally insulative material disposed on an outer surface of the thermally conductive plate.

6. The apparatus of claim 1, wherein the one or more thermoelectric devices comprises at least two thermoelectric devices, wherein at least one thermoelectric device is disposed on opposing sides of the body proximate the opening.

7. The apparatus of claim 6, wherein the at least two thermoelectric devices comprises four thermoelectric devices disposed on opposing sides of the body proximate the opening.

8. The apparatus of claim 1, wherein the one or more thermoelectric devices comprise at least two thermoelectric devices stacked atop one another to provide a thermal gradient across the body.

9. The apparatus of claim 1, wherein the storage container comprises one or more ports configured to be coupled to conduits for providing the liquid or solid precursor to the storage container.

10. The apparatus of claim 1, further comprising:
    a thermally insulative material disposed between the heat sink and the body such that the heat sink is substantially only thermally coupled to the one or more thermoelectric devices.

11. The apparatus of claim 1, wherein the one or more thermoelectric devices are at least partially set into the body, and wherein the body further comprises one or more recesses formed in the body configured to route electrical cables for operation of the one or more thermoelectric devices.

12. The apparatus of claim 1, further comprising:
    a thermocouple coupled to the body to measure a temperature of the storage container.

13. An apparatus for thermal management of a precursor for use in substrate processing, comprising:
    a body having an opening sized to receive a storage container having a liquid or solid precursor disposed therein, the body fabricated from thermally conductive material wherein the storage container comprises one or more ports configured to be coupled to conduits for providing the liquid or solid precursor to the storage container;
    one or more thermoelectric devices coupled to the body proximate the opening; and
    a heat sink coupled to the one or more thermoelectric devices.

14. An apparatus for thermal management of a precursor for use in substrate processing, comprising:
  a body fabricated from a thermally conductive material, the body comprising two separable parts and an opening sized to receive a storage container at least partially formed in each of the two separable parts, wherein the storage container is configured to contain a liquid or solid precursor;
  one or more thermoelectric devices coupled to the body proximate the opening;
  a heat sink coupled to the one or more thermoelectric devices; and
  a thermally conductive plate coupled to each of the two separable parts of the body on a first side of the body and a second side of the body, opposite the first side.

15. The apparatus of claim 14, further comprising:
  a thermally insulative material disposed on one or more outer surfaces of the body.

16. The apparatus of claim 15, further comprising:
  a thermally insulative material disposed on an outer surface of the thermally conductive plate.

17. The apparatus of claim 14, further comprising:
  a thermally insulative material disposed between the heat sink and the body such that the heat sink is substantially only thermally coupled to the one or more thermoelectric devices.

18. The apparatus of claim 14, wherein the storage container comprises one or more ports configured to be coupled to conduits for providing the liquid or solid precursor to the storage container.

19. The apparatus of claim 14, wherein the one or more thermoelectric devices comprise at least two thermoelectric devices stacked atop one another to provide a thermal gradient across the body.

* * * * *